(12) United States Patent
Cuellar et al.

(10) Patent No.: US 7,341,464 B2
(45) Date of Patent: Mar. 11, 2008

(54) MEMORY DEVICE WITH LATCHING CAP FOR USB PLUG

(75) Inventors: Edwin J. Cuellar, San Jose, CA (US); Ning Liu, Xixiang (CN); Robert C. Miller, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/273,729

(22) Filed: Nov. 14, 2005

(65) Prior Publication Data

US 2007/0111583 A1    May 17, 2007

(51) Int. Cl.
*H01R 13/44* (2006.01)
(52) U.S. Cl. ........................ 439/135; 439/358
(58) Field of Classification Search ................ 439/353, 439/135, 149, 352, 270, 346; 361/752, 737
See application file for complete search history.

(56) References Cited

U.S. PATENT DOCUMENTS

| | | | | |
|---|---|---|---|---|
| 5,011,424 | A * | 4/1991 | Simmons | 439/352 |
| 6,456,500 | B1 * | 9/2002 | Chen | 361/752 |
| 6,522,534 | B1 * | 2/2003 | Wu | 361/686 |
| 6,561,421 | B1 * | 5/2003 | Yu | 235/451 |
| 6,612,853 | B2 * | 9/2003 | Wu | 439/136 |
| 6,763,410 | B2 * | 7/2004 | Yu | 710/74 |
| 6,773,192 | B1 * | 8/2004 | Chao | 401/195 |
| 6,905,352 | B2 * | 6/2005 | Chao | 439/135 |
| 6,999,322 | B1 * | 2/2006 | Lin | 361/752 |
| D521,509 | S * | 5/2006 | Chen | D14/356 |

FOREIGN PATENT DOCUMENTS

| | | |
|---|---|---|
| JP | 2003-282178 | 10/2003 |
| KR | 10-0471154 | 3/2005 |
| WO | WO 97/29527 | 8/1997 |

OTHER PUBLICATIONS

SanDisk Corporation, SanDisk® Cruzer® Profile USB Flash Drive, product description, 2005, http://www.sandisk.com/download/photos/retail/cruzerprofile_open.jpg, 3 pages.

(Continued)

*Primary Examiner*—Tulsidas C. Patel
*Assistant Examiner*—Harshad C. Patel
(74) *Attorney, Agent, or Firm*—Davis Wright Tremaine LLP

(57) ABSTRACT

A mating plug and receptacle are positively held together by a latch that is manually releasable to allow their separation. An example is a USB plug with a cap having a receptacle into which the plug is inserted for protection when the plug is not in use. In a preferred embodiment, a slide is carried within the receptacle to move a distance with the plug as it is inserted into and withdrawn from the receptacle. Latches prevent movement of the slide to release the plug until an external actuator is manually operated. Detents on arms formed as part of the slide engage holes in the plug when the plug is inserted into the receptacle but are released by riding against cam surfaces as the slide, after being unlatched, moves upon withdrawal of the plug from the receptacle.

10 Claims, 5 Drawing Sheets

OTHER PUBLICATIONS

SanDisk Corporation, SanDisk Cruzer™ Mini USB Flash Drive, product description, www.sandisk.com, 2005, 2 pages.

SanDisk Corporation, Cruzer™ Micro With Skins, http://www.sandisk.com/retail/cruzer-micro.asp, downloaded Oct. 11, 2005, 2 pages.

SanDisk Corporation, Cruzer® Freedom, http://www.sandisk.com/retail/cruzer-freedom.asp, downloaded Oct. 11, 2005, 2 pages.

SanDisk Corporation, SanDisk Cruzer USB Flash Drives, product description, 2005, 2 pages.

* cited by examiner

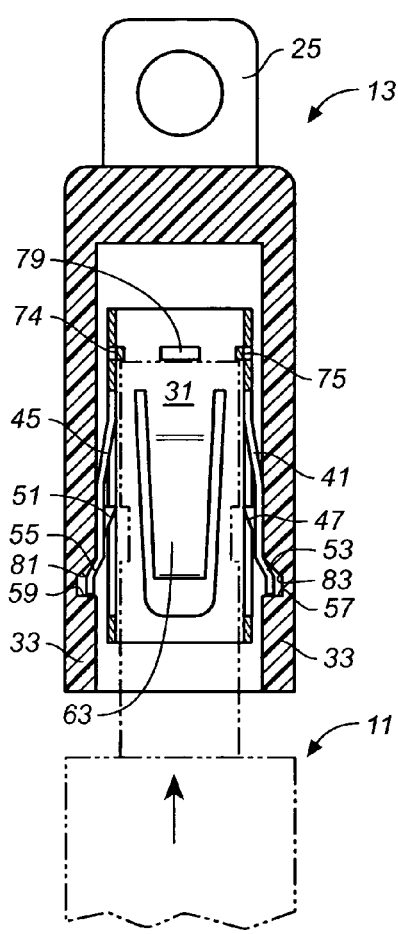
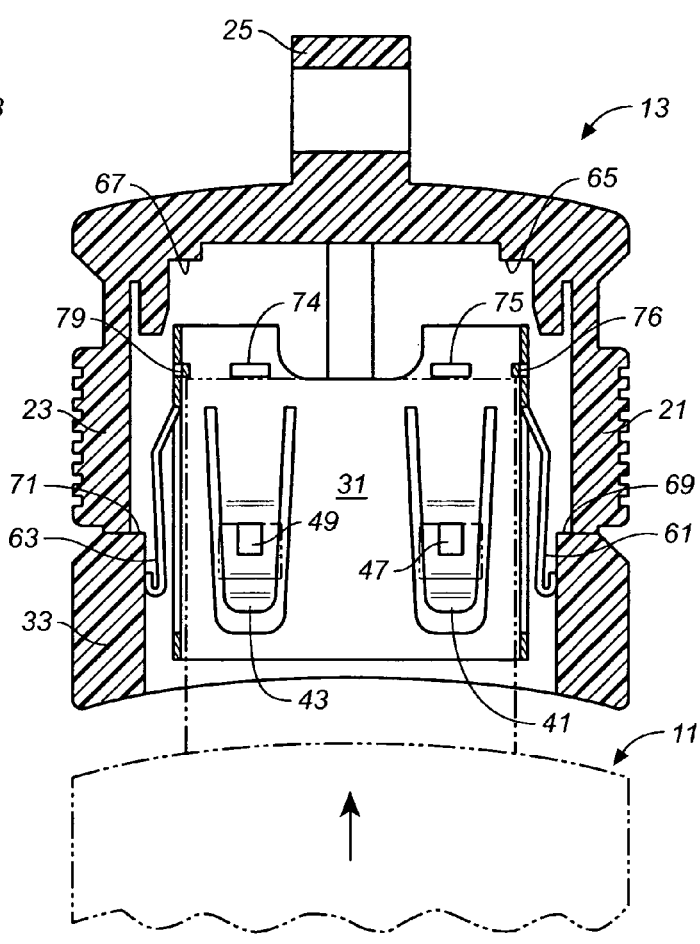
FIG. 2B
FIG. 3B

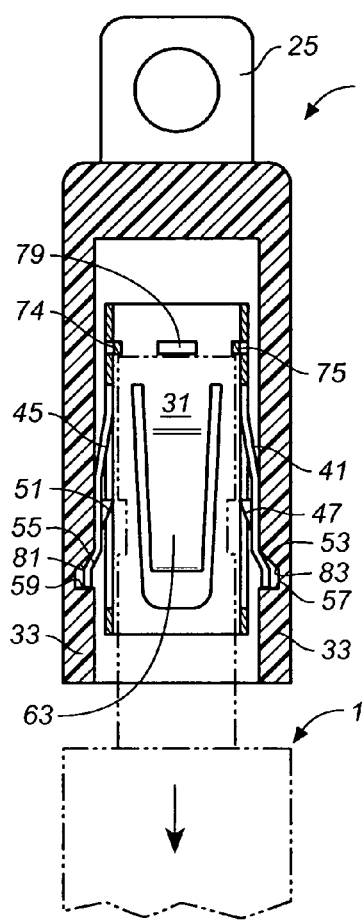
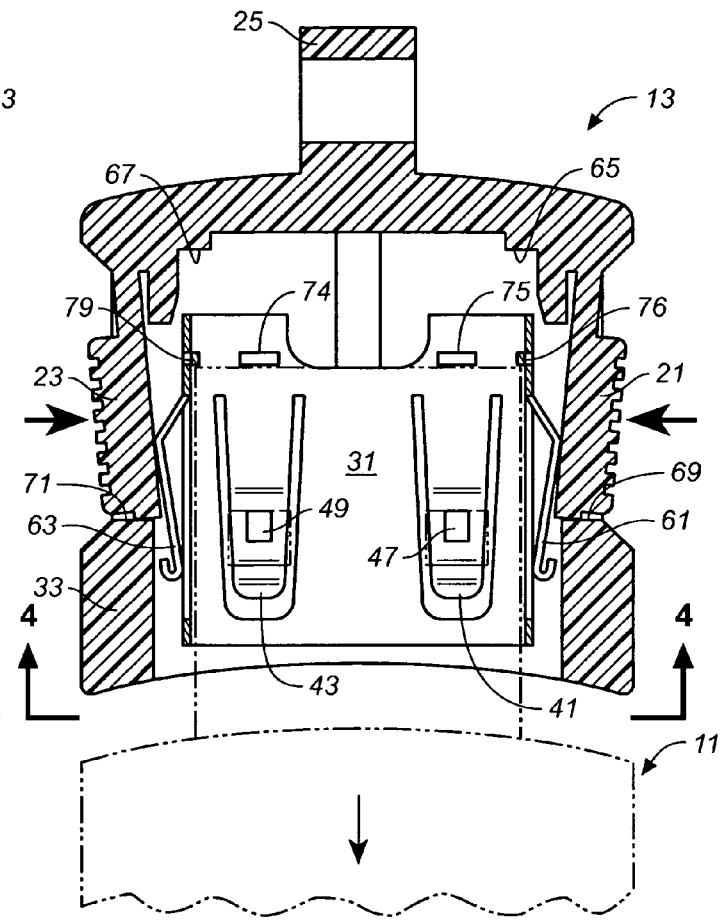
FIG. 2D  FIG. 3D
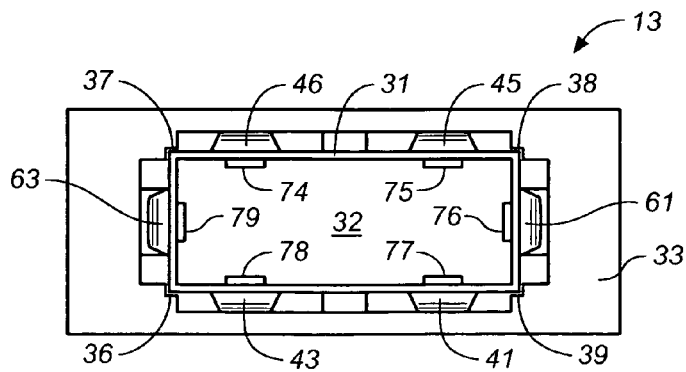
FIG. 4

MEMORY DEVICE WITH LATCHING CAP FOR USB PLUG

BACKGROUND

This application relates generally to mating plugs and receptacles, such as an electrical plug following the Universal Serial Bus (USB) standard and a receptacle therefore, and, more specifically, to a cap having a receptacle into which a USB plug, such as a plug integrally formed on a portable integrated circuit memory device, is inserted for protection. All patents, patent applications, articles, other publications and things referenced herein are hereby incorporated herein by this reference in their entirety for all purposes.

A class of non-volatile semiconductor flash memories, commonly called flash drives, are small hand-held portable devices that contain a USB plug as an integral part of them. The USB plug is inserted during use into a USB receptacle of a host system such as a personal computer (PC), notebook computer, portable digital assistant (PDA) and the like. The memory system within the flash drive is electrically connected to the host system through the USB connector for transferring data therebetween, and the memory system also receives operating power through the USB connector. A line of USB flash drives is sold by SanDisk Corporation, assignee of the present application, under its Cruzer trademark.

Flash drives are typically sold with caps for the user to place on the USB plug when the device is not being used. Such caps are most commonly simple plastic coverings that easily slip on and off the plug. Some caps, however, are provided with a more positive attachment mechanism that positively latches them on the plug. Since the purpose of the caps is to protect the exposed plug, no connection is made with the conductors of the plug onto which they are placed.

SUMMARY

A receptacle for receiving a male plug is provided with a positive latching mechanism that is released by the user operating an external actuator. Insertion of the plug into the receptacle causes a detent within the receptacle to engage an aperture in the plug. They remain connected until the actuator is operated, at which time the plug is removed from the receptacle. The receptacle may be in a protective cap that is placed on the plug when it is not in use.

In a specific implementation, a cap for a USB plug, such as that provided on flash drives, is provided with a slide mechanism that longitudinally moves within a shell between two positions, an inner position when the plug is inserted and an outer position when the plug is withdrawn. The slide is connectable to both the plug and the cap shell when in its inner position, thereby holding the cap on the plug. When the plug is inserted, it moves the slide to its inner position where one or more detents on the slide positively engage a corresponding one or more openings in the outer surface of the plug and one or more latches hold the slide fixed with respect to the shell. Actuation of one or more buttons on the outside of the shell releases the latches so that the plug, still attached to the slide through the latches, may be withdrawn. Upon withdrawal of the plug, the slide moves to is outer most position. During this movement, the detents on the slide are removed from the openings in the plug by the resilience of fingers of the slide to which the detents are attached moving against cam surfaces of the shell. The plug is then free to be removed from the cap.

Additional aspects, advantages and features of the present invention are included in the following description of exemplary examples thereof, which description should be taken in conjunction with the accompanying drawings.

BRIEF DESCRIPTION OF THE DRAWINGS

FIGS. 2A-2D are cross-sectional views of the cap of FIGS. 1A-1B with the flash drive plug removed, partially inserted, fully inserted and being removed, respectively;

FIGS. 3A-3D are cross-sectional views of the cap of FIGS. 1A-1B, in a direction through the cap that is orthogonal to the respective sectional views of FIGS. 2A-2D, with the flash drive plug removed, partially inserted, fully inserted and being removed, respectively; and FIG. 4 is an end view of the cap of FIGS. 1A-3D.

DETAILED DESCRIPTION OF EXEMPLARY EMBODIMENTS

Figure 1A:
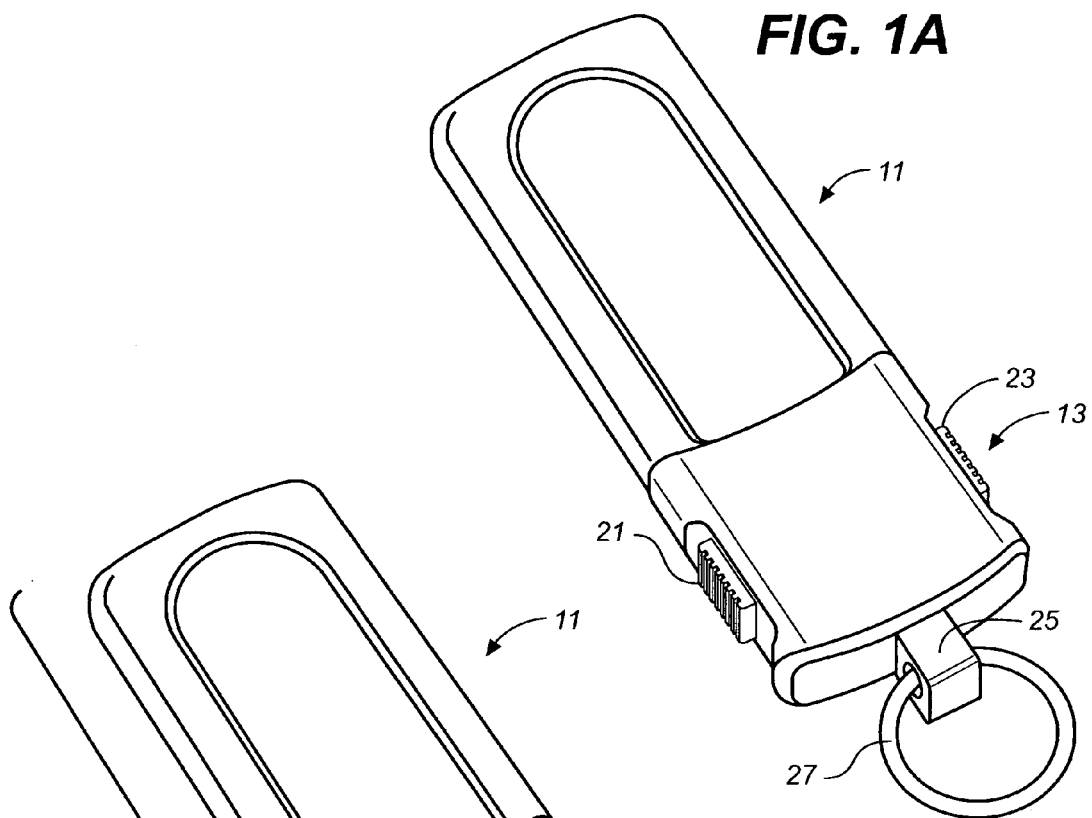
FIGS. 1A and 1B show an example flash drive with a cap respectively attached and removed from a plug thereof.
Figure 1B:
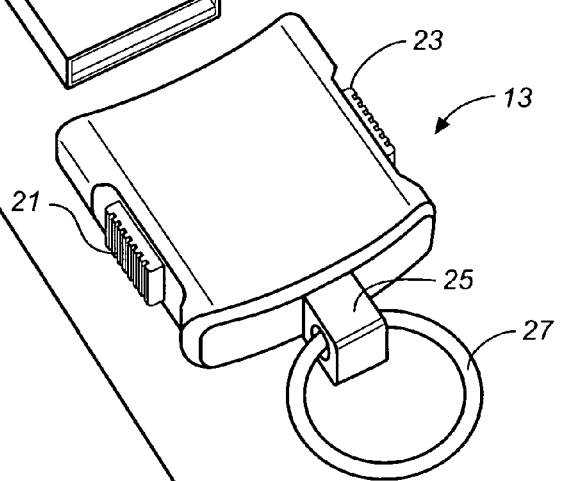

Referring initially to FIGS. 1A and 1B, a flash drive 11 has a cap 13 attached to (FIG. 1A) and removed from (FIG. 1B) a plug 15 that is an integral part of the flash drive 11. A body of the flash drive 11 encloses one or more integrated circuits that form a reprogrammable non-volatile memory system such as flash memory. Data are written to and read from this memory through contacts within the plug 15, when the plug is inserted into a mating receptacle of a host system. The plug 15 also contains conductors that provide the memory system power from the host. The plug 15, in this example, follows the USB specifications, having an outer metal shield with apertures 17 and 19 therein and another pair of apertures (not shown in FIGS. 1A and 1B) on an opposite side, another aperture 20 being shown in FIG. 2A.

The cap 13 contains buttons 21 and 23 that, when manually pushed, release the cap from positive connection to the plug. An extension 25 of the cap carries a ring 27 for attachment to a key ring, necklace, or the like, to facilitate the user carrying the flash drive on his or her person.

Figures 2A, 3A:
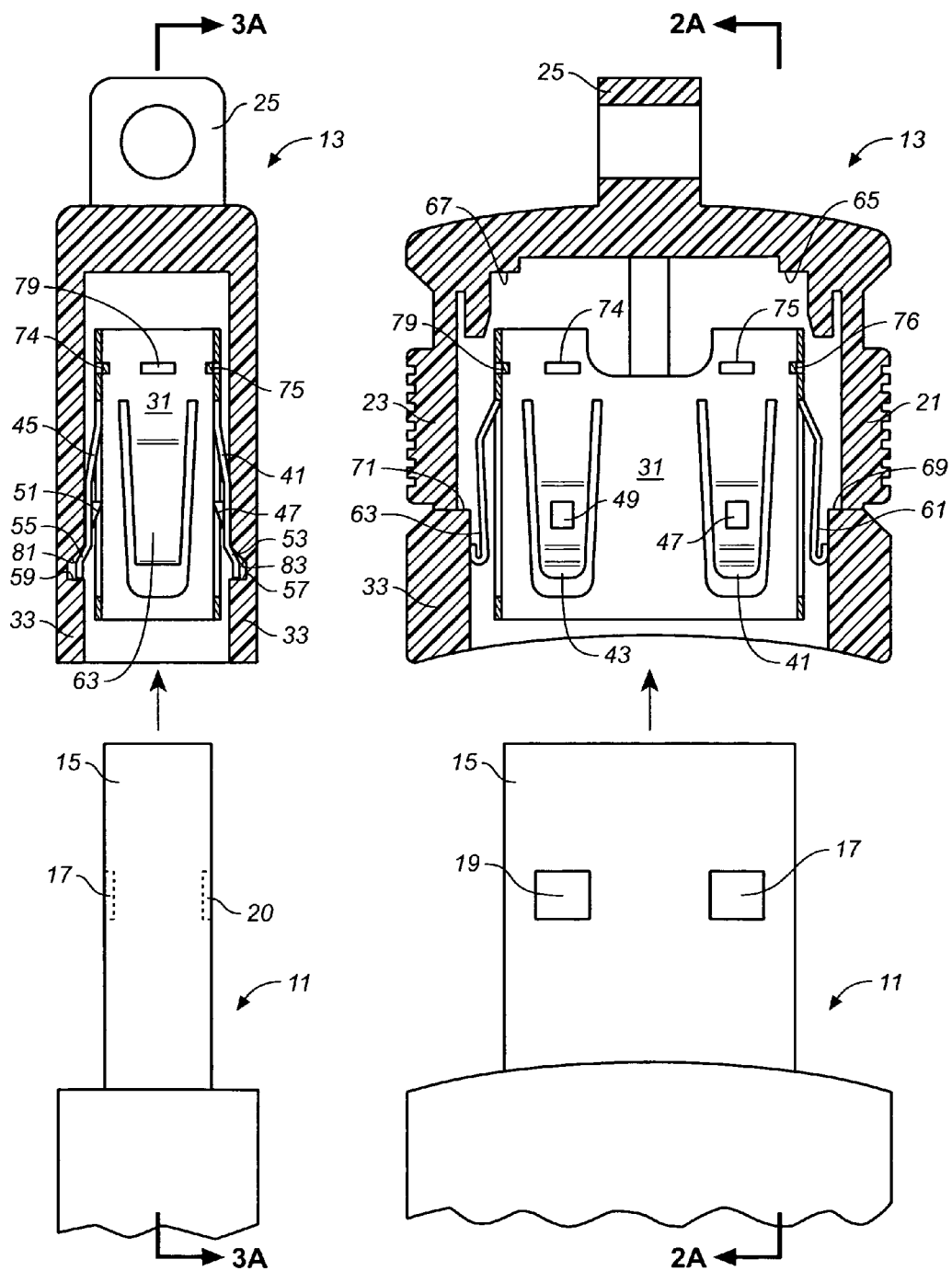

With reference primarily to FIGS. 2A, 3A and 4, the mechanism within the cap 13 is generally described. A slide 31, preferably made of a metal material, is positioned within an outer shell 33 that is preferably molded from plastic. The slide 31 has sidewalls forming a rectangle as viewed from an end (FIG. 4) that provides an open center 32 and is movable back-and-forth along the length of the shell 33 in grooves 36-39 (FIG. 4) at corners within the shell 33. The open center 32 is shaped and sized to receive the USB plug 15 therein. The slide 31 contains fingers 41 and 43 in one wall, and fingers 45 and 46 in an opposite wall, containing respective detents 47, 49, 51 and another (not shown) extending inward of the slide 31. These fingers may each be pushed into the center 32 of the slide 31 but resiliently return to their rest position when the deforming force is removed.

The detents 47, 49, 51 and the other not shown are positioned to engage the apertures 17, 19, 20 and another not shown of the USB plug 15, when the fingers 41, 43, 45 and 46 are urged against their resilience into the center 32 of the slide 31. These fingers are bent outward of the slide walls in which they are formed, as shown in FIG. 2A, and their resilience urges their outer surfaces against inside surfaces of the shell 33. Ends 53 and 55 of the fingers 41 and 45 abut walls 57 and 59 of grooves within the shell 33. Ends of the other two fingers similarly abut these groove walls. This defines an outer extreme position of the slide 31, beyond which the slide 31 will not move toward the opening in the shell 33. This is the position taken by the slide 31 after the plug 15 is withdrawn from the cap.

Continuing to refer to FIGS. 2A, 3A and 4, arms 61 and 63 are formed on opposite sidewalls of the slide 31, also resiliently biased outward of its center 32. In their positions shown in FIG. 3A, the arms 61 and 63 are resiliently urged against inside surfaces of the cap shell 33. The slide 31 is moved to an inner extreme position (shown in FIG. 3C) with an end abutting against end surfaces 65 and 67 of the shell 33. In this position, the arms 61 and 63 snap outward so that their ends abut ledges 69 and 71 within the shell 33. The slide is thus also restrained against movement in a direction out of the cap 13 by the arms 61 and 63. The buttons 21 and 23 are formed as hinged portions of the walls of the shell 33. When the buttons are pushed inward by hand actuation, as shown in FIG. 3D, the arms 61 and 63 are pushed against their resilience to positions where their ends have moved off the ledges 69 and 71, thus allowing the slide 31 to be moved away from its inner most position.

Operation of the mechanism within the cap 13 will now be explained by reference to the sequential views of the drawings. The slide 31 is in its outer most position shown in FIGS. 2A and 3A when the cap 13 is removed from the plug 15. FIGS. 2B and 3B show the plug in dashed outline having entered into the inside space 31 of the slide 31 but not yet moving the slide from its position shown in FIGS. 2A and 3A. An end of the plug abuts stops 74-79 (also see FIG. 4) that are integral with the slide 31 and extend inward of it. When the plug is pushed further within the cap, the slide 31 is moved within the shell 33 to its inner-most position shown in FIGS. 2C and 3C. The arms 61 and 63 in that position snap against the ledges 69 and 71, respectively, to hold the slide 31 in this extreme position within the cap.

Figures 2C, 3C:
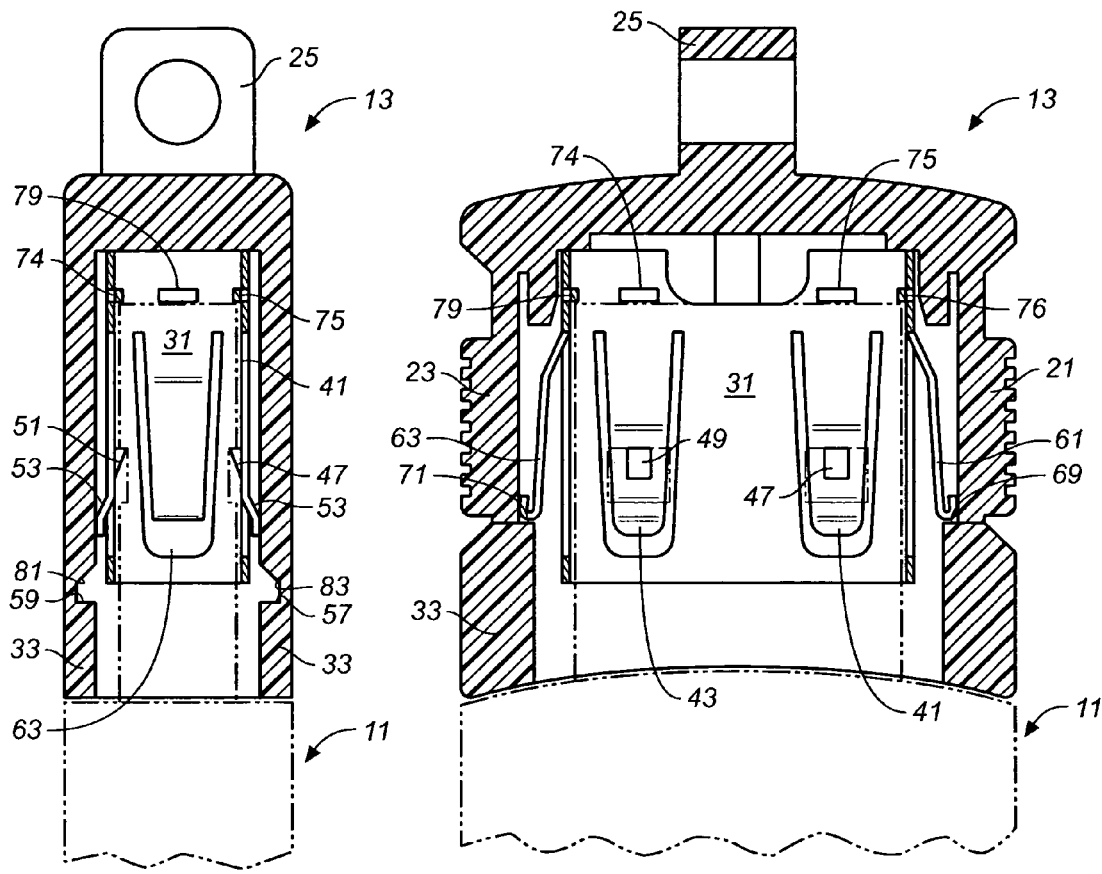

In the course of the plug and slide moving from their positions of FIGS. 2B and 3B to those shown in FIGS. 2C and 3C, the slide is also positively attached to the plug, thereby holding the cap firmly on the plug. The fingers 41, 43, 45 and 46 are urged inward against their resilience, as the slide is moved between these two positions, so that their detents 47, 49, 51 and another not shown are inserted into respective ones of the holes 17, 19, 20 and another not shown of the plug 15. FIGS. 2C and 3C show the slide 31 to be attached in this manner to the plug 15. The end portions of the fingers, such as segments 53 and 55 of the fingers 41 and 45, are shaped relative to top surfaces 81 and 83 of the grooves on the inside surface of the shell to cause the fingers to move inward of the shell as it is moved from the position of FIGS. 2B and 3B to that of FIGS. 2C and 3C. The shape of the shell grooves provide a cam surface and the fingers are cam followers. The detents on the fingers are thus inserted into the holes of the plugs to prevent the cap from being removed until the buttons 21 and 23 are pushed inward.

When the buttons are so pushed, as shown in FIG. 3D, the slide 31 and plug 15, still attached at first, may be withdrawn. The motion of the slide 31 is limited by the ends of the fingers engaging the groove edges 57 and 59. But by that time, the detents have been withdrawn from the apertures of the plug, as shown in FIGS. 2D and 3D. As soon as the slide is withdrawn with the plug to the point that the ends 53 and 55 of the fingers move sufficiently outward over the inner shell groove surfaces 81 and 83, the detents carried by them are withdrawn from the plug holes. Therefore, although the slide is constrained to stay within the cap, the plug may be removed completely since it as been disengaged from the slide.

In this example described with respect to the drawings, four fingers, four detents attached thereto and four holes in the plug are shown. However, the same principle of operation may be utilized with some other number of fingers, detents and/or holes in the plug. The mechanism will operate as intended, for example, if only one finger with its detent is formed as part of the slide, which then engages only one aperture in the plug. Similarly, a single latching arm and external button actuator may be used instead of the two shown. However, use of multiple such elements, like is shown in the drawings and described above, tend to operate better.

Although the various aspects of the present invention have been described with respect to exemplary embodiments thereof, it will be understood that the present invention is entitled to protection within the full scope of the appended claims.

The invention claimed is:

1. A mating receptacle and plug assembly, comprising:
   the plug includes a recess in an outer surface thereof,
   a mechanism within the receptacle including a detent that engages the recess in the mating plug outer surface when the plug is inserted into the receptacle, thereby to hold the receptacle and plug together, wherein the mechanism within the receptacle includes a slide with the detent resiliently urged against a cam surface within the receptacle that causes the detent to disengage from the plug recess as a result of the slide moving within the receptacle as the plug is withdrawn from the receptacle, thereby to cause the detent to move along the cam surface as the plug is withdrawn from the receptacle and the resilience of the detent to cause it to disengage from the plug recess, and
   a manual actuator accessible from outside the receptacle and coupled with the mechanism within the receptacle to enable when the mechanism is actuated, the detent to disengage from the plug recess as a result of relative motion between the receptacle and the plug as the plug is withdrawn from the receptacle.

2. An attachment with a cavity that fits over a USB plug having recesses in an outer conductive shield that surrounds electrical plug contacts, comprising:
   a mechanism within the cavity including at least one detent that engages at least one of the recesses in the USB plug outer shield when the plug is inserted into the cavity, thereby to hold the attachment against withdrawal from the plug, and
   at least one external manually operated actuator coupled with the mechanism in a manner to allow the detent to be withdrawn from said at least one of the recesses in order for the plug to be removed from the cavity.

3. The attachment of claim 2, wherein the mechanism includes:
   an insert moveable within the cavity from a first position when the plug is fully inserted into the cavity and a second position when the plug is withdrawn from the cavity, and
   wherein the insert carries said at least one detent in a manner that the detent is moved into engagement with the recess of the USB plug as the insert moves from the second position to the first position in response to the USB plug being inserted into the cavity.

4. The attachment of claim 3, additionally comprising at least one cam surface within the cavity over which said at least one detent rides as the insert is moved between its first and second positions, the cam surface being shaped (1) to cause the detent to be urged into said at least one of the recesses of the USB plug as the insert moves from the second position to the first position as a result of the USB plug being inserted into the cavity and (2) to cause the detent to resiliently remove itself from said at least one of the recesses of the USB plug as the insert moves from the first position to the second position as a result of the USB plug being withdrawn from the cavity.

5. The attachment of claim 4, additionally comprising a latch within the plug that holds the slide in its said first position when the plug is inserted into the cavity, and wherein said at least one external manually operated actuator is coupled with the latch to release the slide from its said first position when the actuator is operated.

6. The attachment of claim 2, wherein the USB plug is attached to a memory device and the electrical plug contacts are connected to a memory system therein.

7. In a combination of a memory device with a plug extending therefrom that has recesses in a surface thereof and a cap removably attachable to the plug, the cap comprising:
    a slide within the cap that moves between a first position when the cap is inserted onto the plug and a second position when the cap is withdrawn from the plug,
    a cam surface within the cap, and
    at least one detent carried by the slide in a position to be urged by the cam surface into at least one of the plug recesses when the slide is in its first position and allowed by its own resilience to withdraw from said at least one of the plug recesses when the slide is in its second position.

8. The combination of claim 7, wherein the slide includes a rectangularly shaped opening surrounded by four walls that receives the plug when the cap is inserted onto the plug, and said at least one detent is formed on a finger that carried as part of one of the slide walls but allowed to flex with respect thereto.

9. The combination of claim 7, wherein the slide includes a rectangularly shaped opening surrounded by four walls that receives the plug when the cap is inserted onto the plug, and the cap additionally comprises at least one arm formed as part of one of the slide walls to normally extend outward in a position to engage a stop within the cap that prevents the slide from moving from the first position to the second position, and an external element that causes said at least one arm to move to a position that disengages the stop when the external element is actuated.

10. The combination of claim 7, wherein the slide is made of a metal material and slides within an outer case of the cap that is made of molded plastic.

* * * * *